US006635308B1

(12) United States Patent
Forrest et al.

(10) Patent No.: US 6,635,308 B1
(45) Date of Patent: Oct. 21, 2003

(54) METHOD AND APPARATUS FOR ELECTRONICS BOARD RETENTION DURING MANUFACTURING OPERATIONS

(75) Inventors: Jeff Forrest, Gilbert, AZ (US); Ed Allen Klassen, Phoenix, AZ (US); Gregory Charles Wade, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 525 days.

(21) Appl. No.: 09/644,344

(22) Filed: Aug. 22, 2000

(51) Int. Cl.[7] ................................. B05D 5/12
(52) U.S. Cl. ..................... 427/96; 29/559; 101/129; 228/180.1
(58) Field of Search ........................... 29/559; 118/500; 427/96; 269/900, 903, 21; 101/127.1, 129; 228/180.1

(56) References Cited

U.S. PATENT DOCUMENTS

| | | | | |
|---|---|---|---|---|
| 5,067,695 A | * | 11/1991 | Huddleston | 269/21 |
| 5,713,563 A | * | 2/1998 | Chan | 269/27 |
| 5,932,065 A | * | 8/1999 | Mitchell | 156/556 |
| 5,984,293 A | * | 11/1999 | Abrahamson et al. | 269/266 |
| 6,093,249 A | * | 7/2000 | Curtin | 118/500 |
| 6,189,876 B1 | * | 2/2001 | Frazier | 269/21 |

* cited by examiner

Primary Examiner—Brian K. Talbot
(74) Attorney, Agent, or Firm—Kevin D. Wills

(57) ABSTRACT

This abstract is being provided in accordance with the provisions of Section 1.72 of the Rules of Practice in Patent and Trademark Cases (37 CFR). The applicant intends that this abstract be used only to aid in determining the general nature of the technical disclosure. The applicant does not intend that this abstract be looked to in order to aid or assist in the determination of the scope of any claim.

An electronics board (150) is retained by an arrangement of support members (120) or support pins (620) during manufacturing operations conducted on the electronics board (150). The arrangement corresponds to the locations on the electronics board where support members (120) can be placed without interfering with components mounted to the electronics board (150). This information is used to form a transparent template (110, 610) which is placed atop a metallic support plate (100). In one embodiment of the invention, support members (120) include a magnetic base which is inserted through the perforations of the support plate (100, 500). Vacuum driven chucks (200) are placed on the template (110) order to restrict the movement of the electronics board (150) during the application of solder paste to the electronics board (150). In another embodiment, a template (610) is used to determine locations for support pins on a support plate (500) which includes a two-dimensional grid pattern of holes.

5 Claims, 5 Drawing Sheets

METHOD AND APPARATUS FOR ELECTRONICS BOARD RETENTION DURING MANUFACTURING OPERATIONS

FIELD OF THE INVENTION

The invention relates to the field of manufacturing and, more particularly, to a method and apparatus for electronics board retention during various manufacturing operations.

BACKGROUND OF THE INVENTION

In a high-volume electronics board manufacturing environment, various types of automated equipment are used at different stages in the manufacturing process. For example, a screen printer may be used in order to apply solder paste to a side of an electronics board, while automated pick-and-place equipment is used to place electronic components onto the electronics board. Each of these operations presents challenges in reducing the time and the associated equipment required to prepare the automated equipment to accommodate a particular electronics board.

During the application of the solder paste, for example, the screen printer must incorporate a means to retain and support the electronics board so that the viscous solder paste can be applied. This process typically requires a support plate which incorporates support struts which are permanently affixed to the support plate for each type of electronics board. For a two-sided electronics board, a unique support plate is usually required for each side of the electronics board. Thus, in a high mix environment, where many different types of electronics boards are undergoing solder paste screen-printing, a large number of support plates, each with a unique arrangement of support struts, may be required.

At another point in the manufacturing process, an electronics board may be placed into an automated pick-and-place machine so that components can be placed on the electronics board. During this stage, the electronics board must also be held into place to ensure that component leads can be subsequently soldered into place. During this operation, a unique support plate is typically required for each type of electronics board being manufactured. Additionally, two such unique support plates may be required when two sided boards are being manufactured.

Thus, it is highly desirable to make use of an improved method and apparatus for electronics board retention during manufacturing operations. This can reduce the number of support plates having unique support strut arrangements required to enable solder paste screen-printing and pick-and-place component location for each of the different types of electronics boards being manufactured. Additionally, the method is useful in reducing the setup time required to prepare the equipment to accommodate each type of electronics board.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

DESCRIPTION OF THE PREFERRED EMBODIMENTS

A method and apparatus for electronics board retention during manufacturing operations can eliminate the need for support plates having customized support member arrangements for each electronics board type. This can be especially advantageous in high mix manufacturing environments where many such support plates incorporating unique support member arrangements are needed in order to conduct manufacturing operations on each type of electronics board. Additionally, the method and apparatus can significantly reduce the setup time required to prepare the equipment used in manufacturing operations such as solder paste application and automated component location. The method and apparatus do not require sophisticated tooling and can be used in conjunction with various equipment types used in electronics board manufacturing environments.

Figure 1:
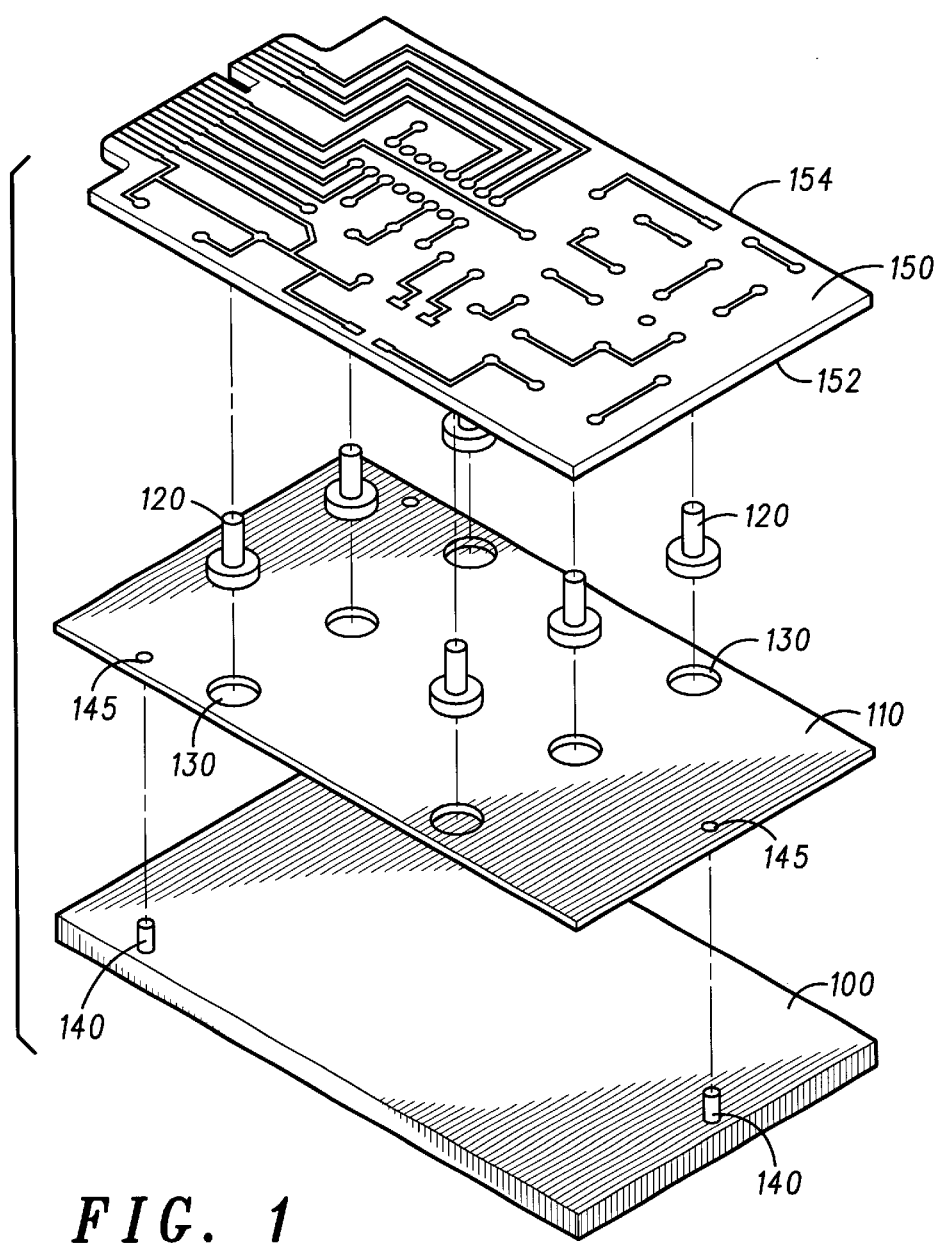
FIG. 1 is an exploded view of an apparatus for electronics board retention during solder paste application in accordance with a preferred embodiment of the invention.

FIG. 1 is an exploded view of an apparatus for electronics board retention during solder paste application in accordance with a preferred embodiment of the invention. In FIG. 1, electronics board 150 includes first side 152, and second side 154. Electronics board 150 preferably incorporates components on both first and second sides 152 and 154, respectively, thus allowing the most advantageous practice of the inventive principles described herein. However, electronics board 150 may be one-sided without losing the benefits of the inventive principles. Electronics board 150 can be designed to perform a variety of electronic processes and computing, such as signal conditioning, signal processing, power conditioning, or an embedded processing function. Although not shown in FIG. 1, a solder mask is preferably affixed to second side 154 of electronics board 150 in order to facilitate the depositing of solder paste along selected trace patterns, such as those shown in FIG. 1.

Desirably, each of support members 120 includes a magnetic base which is capable of temporarily adhering to support plate 100. Consequently, it is anticipated that support plate 100 is substantially planar and fabricated using a primarily magnetic material, such as iron or steel. Each of support members 120 also includes a slender upper end which is capable of contacting areas free of electronic components on first side 152 of electronics board 150. It is generally anticipated that an operator is required to manually determine the locations on first side 152 which can be retained by one of support members 120 without damaging or otherwise affecting the performance of electronics board 150. Although it is generally expected that the locations on first side 152 are determined manually, nothing prevents the use of a computer in assisting an operator in determining the possible locations of support members 120.

In a preferred embodiment, once the locations on first side 152 of electronics board 150 have been determined, this information is used to determine the locations of perforations 130 in template 110. Thus, when solder paste is to be applied to second side 154 of electronics board 150, template 110 can simply be placed atop support plate 100 and held in place by way of guide pins 140 and guide pin holes 145. Once template 110 is set into place, support members 120 can be adhered to support plate 100 at the correct locations. Electronics board 150 can then be rigidly supported during the application of solder paste to second side 154. This support is preferably complemented through the use of the vacuum driven chuck described herein with reference to FIG. 3. Additionally, although not shown in FIG. 1, template 110 desirably includes at least one clip for routing any required vacuum hose from the vacuum driven chuck to an external vacuum source. Further, guide pins 140 and guide pin holes 145 need not be positioned as shown, but may be situated at any convenient location according to the needs of the particular application.

In the event that the application of solder paste to first side 152 is required after the application of solder paste to second side 154, a second template, similar to template 110 but having a different support member arrangement, can be placed atop support plate 100. In this event, support members 120 can be rearranged as imposed by the second template. Electronics board 150 can then be turned over and rigidly supported by the new arrangement of support members 120 during the application of solder paste to first side 152.

Figure 8:
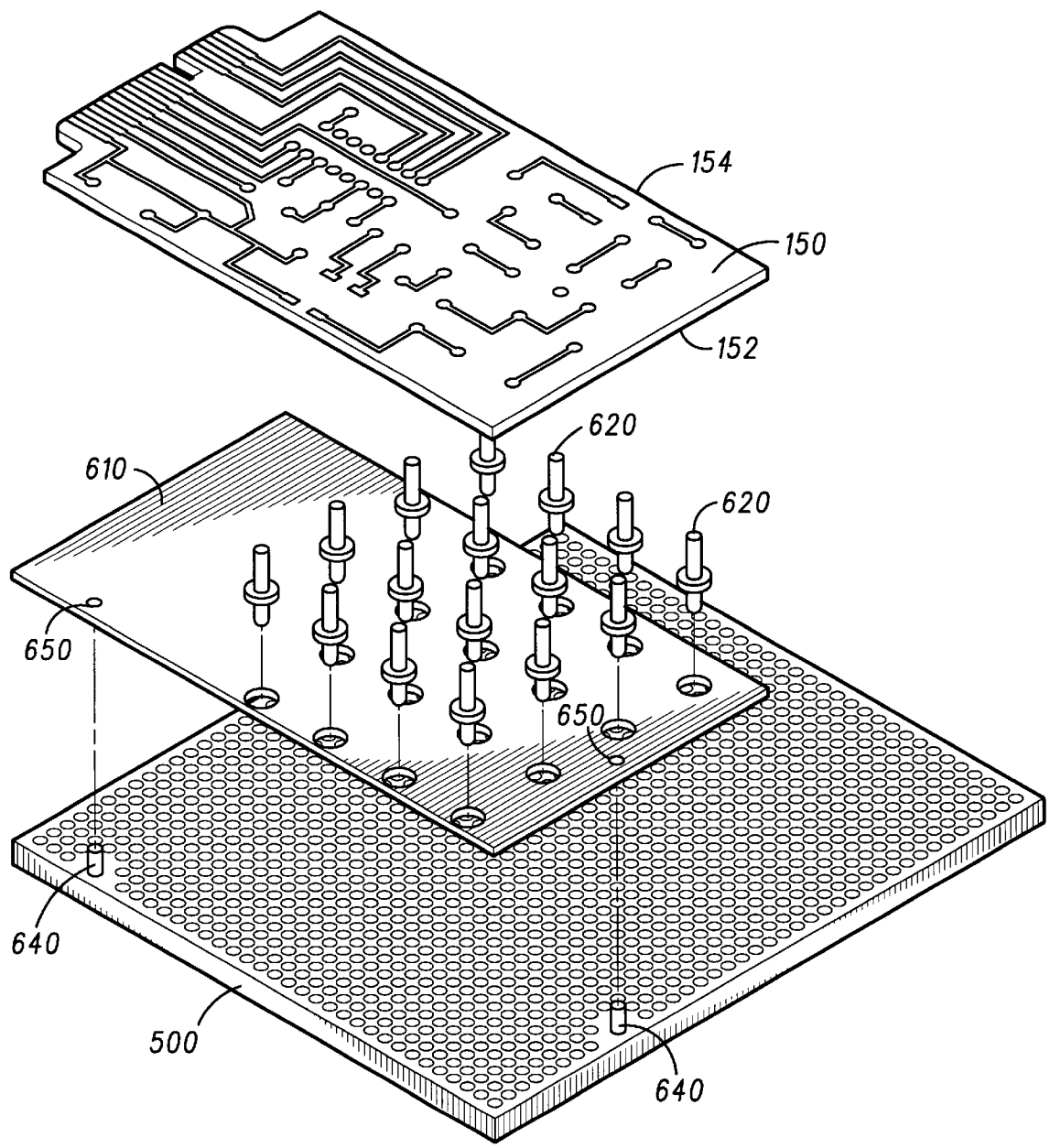
FIG. 8 is an exploded view of an apparatus for electronics board retention during automated component placement in accordance with a preferred embodiment of the invention.
Figure 9:
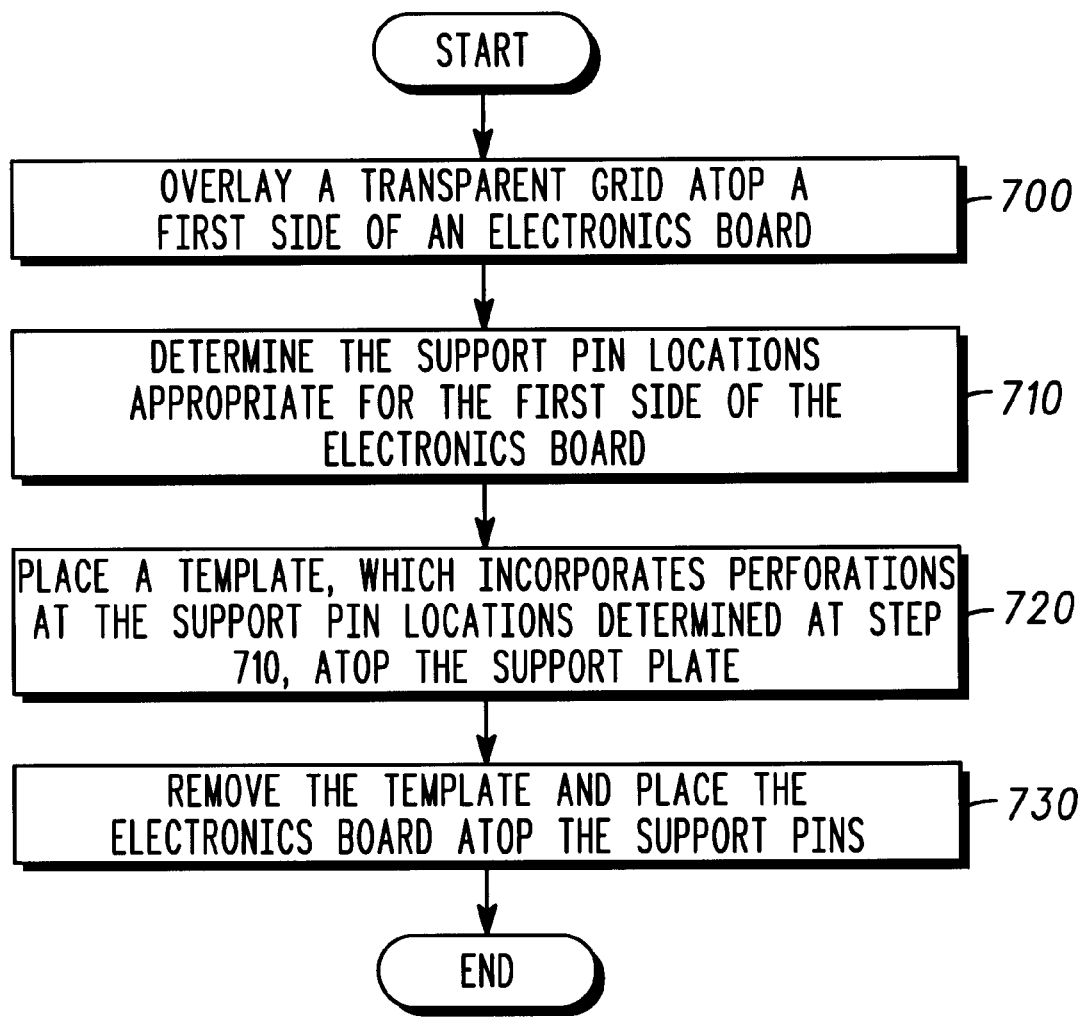
FIG. 9 is a flowchart of a method for determining a support member arrangement used in retaining an electronics board during automated component placement in accordance with an alternate embodiment of the invention.

Although the apparatus of FIG.1 is particularly useful when used in conjunction with screen printers which apply solder paste to electronics boards, nothing prevents the use of an apparatus similar to that of FIG. 1 during other manufacturing operations, such as the automated component placement described in reference to FIGS. 8 and 9, herein.

Figure 2:
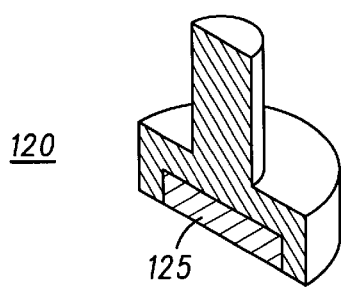
FIG. 2 is a cross sectional view of a support member used in an apparatus for electronics board retention during solder paste application in accordance with a preferred embodiment of the invention.

FIG. 2 is a cross sectional view of a support member used in an apparatus for electronics board retention during solder paste application in accordance with a preferred embodiment of the invention. In FIG. 2, the base of support member 120 includes magnet 125, which enables adherence of the support member to a ferromagnetic surface such as support plate 100 of FIG. 1. Desirably, the remainder of support member 120 comprises aluminum, ceramic, or other nonmagnetic material. This allows the slender end of support member 120 to be placed near magnetic field-generating components resident on electronics board 150 without affecting the performance of these components.

Figure 3:
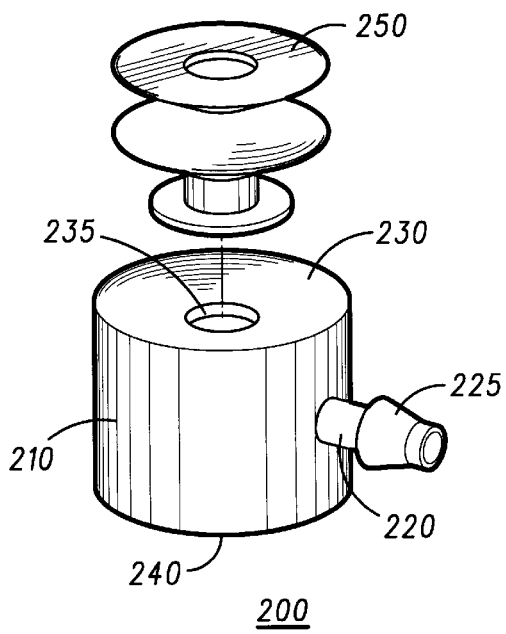
FIG. 3 is an exploded view of a vacuum driven chuck used in an apparatus for electronics board retention during solder paste application in accordance with a preferred embodiment of the invention.

FIG. 3 is an exploded view of a vacuum driven chuck used in an apparatus for electronics board retention during solder paste application in accordance with a preferred embodiment of the invention. Although not shown in the exploded view of FIG. 1, vacuum driven chuck 200 is desirably inserted between electronics board 150 and support plate 100 in order to positively retain the electronics board during the application of solder paste to the appropriate side of the electronics board. Desirably, two or more of vacuum driven chucks 200 provide this positive retention with four representing an optimum number. Also not shown in FIG. 1, template 110 incorporates perforations, such as those used to accommodate each of support members 120, in order to judiciously locate each vacuum driven chuck 200.

The utility of vacuum driven chuck 200 of FIG. 3 is driven by the relatively large viscosity of the solder paste used in a typical screen printer. This excessive viscosity can cause electronics board 150 to remain temporarily adhered to the tool which applies the solder paste. This causes the electronics board to become improperly oriented, thereby allowing solder paste to be unintentionally applied to unsuitable areas of electronics board 150.

Vacuum driven chuck 200 includes hollow body 210, which includes connector 220, top surface 230, and magnetic base 240. In a preferred embodiment, billowed nozzle 250 fits within top surface hole 235. Connector 220, located on a lateral surface of hollow body 210, conveys a vacuum from the vacuum driven chuck 200 to an external vacuum source. Preferably, connector 220 includes a means for coupling to the vacuum hose such as annular barb 225. Thus, when the vacuum is applied, the preferably elastic nature of billowed nozzle 250 contracts and forms a seal which retains electronics board 150 while the solder paste is applied.

To enhance the capability to retain an electronics board, top surface 230 preferably includes a chamfered edge which restricts the lateral movement of the electronics board during the solder paste application process. Although it is desirable that hollow body 210 is substantially cylindrical, nothing prevents hollow body 210 from being shaped in accordance with a polygon, such as a hexagon. Further, although described in an environment which includes vacuum driven chuck 200 retaining an electronics board, nothing prevents the use of vacuum driven chuck 200 in retaining other articles of manufacture in found in other manufacturing environments.

Figure 4:
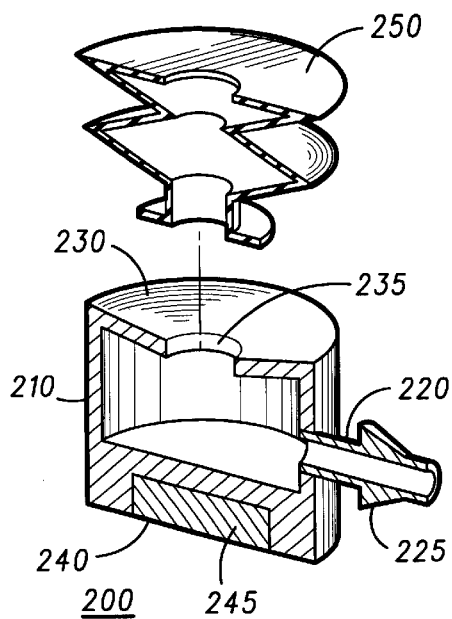
FIG. 4 is a cross sectional view of the vacuum driven chuck of FIG. 3 in accordance with a preferred embodiment of the invention.

FIG. 4 is a cross sectional view of the vacuum driven chuck of FIG. 3 in accordance with a preferred embodiment of the invention. The cross sectional view of FIG. 4 shows the elements of FIG. 3, and further shows magnetic insert 245 which inserts into magnetic base 240. Additionally, the chamfered top surface of the vacuum driven chuck is shown in greater detail as well.

Figure 5:
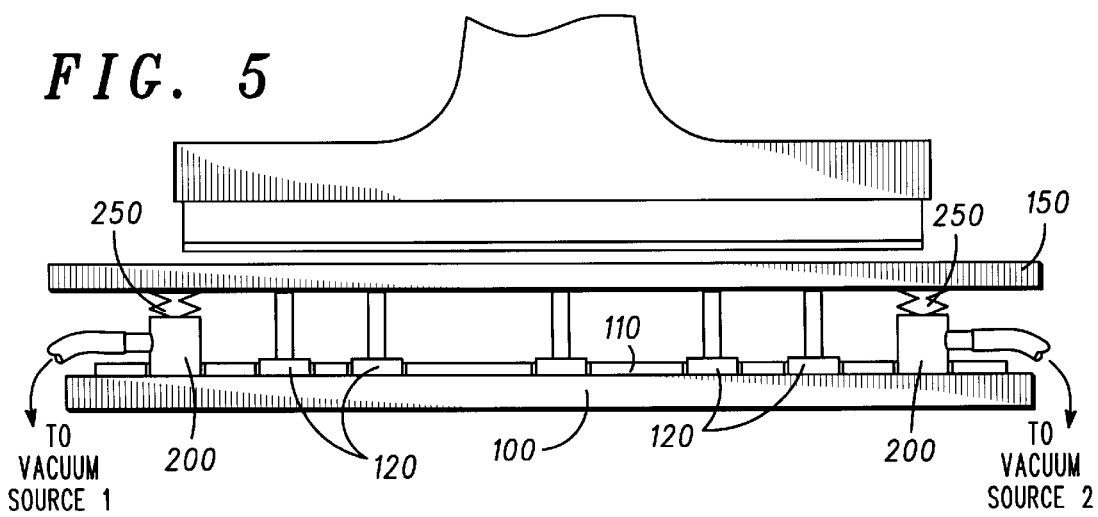
FIG. 5 is an elevation view of a solder paste application device in contact with an electronics board and an apparatus for electronics board retention in accordance with a preferred embodiment of the invention.

FIG. 5 is an elevation view of a solder paste application device in contact with an electronics board and an apparatus for electronics board retention in accordance with a preferred embodiment of the invention. In FIG. 5, support members 120 have been placed atop support plate 100 by way of template 110. In order to positively retain electronics board 150, two vacuum driven chucks 200 have been inserted between the electronics board and the support plate. Solder paste application device 160 is shown in contact with the second side of electronics board 150. Desirably, each of vacuum driven chucks 200 is coupled to a separate vacuum source, thus eliminating the possibility that the loss of integrity of the seal which billowed nozzle 250 makes with electronics board 150 will negatively impact other, similar vacuum driven chucks.

Figure 6:
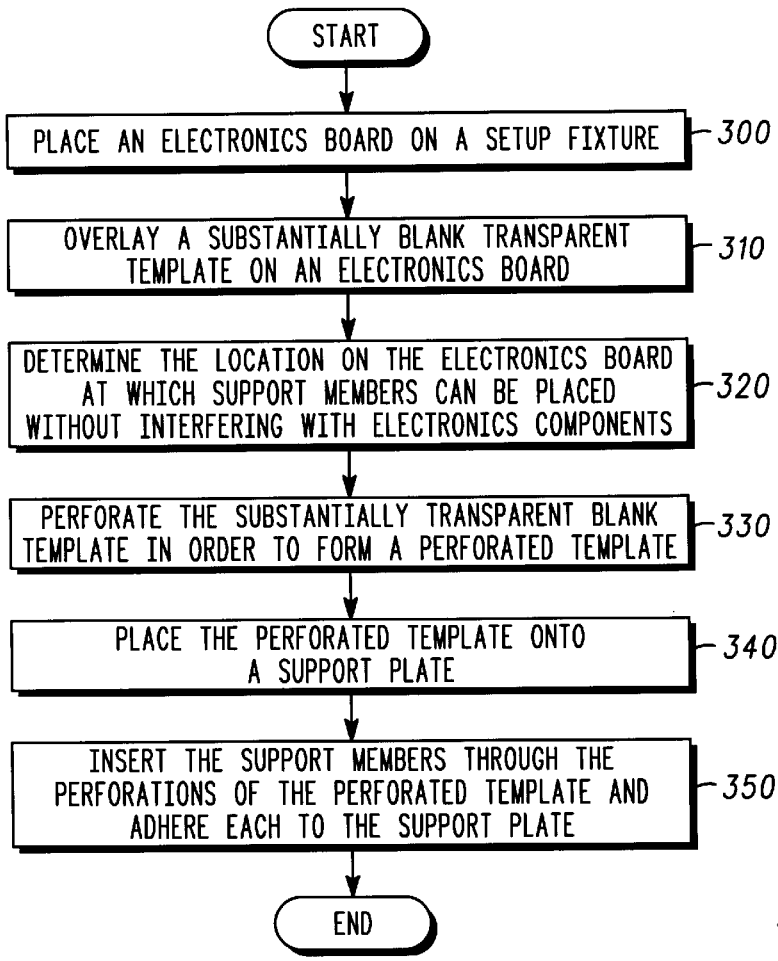
FIG. 6 is a flowchart for a method for determining a support member arrangement used in retaining an electronics board during solder paste application in accordance with a preferred embodiment of the invention.

FIG. 6 is a flowchart for a method for determining a support member arrangement used in retaining an electronics board during solder paste application in accordance with a preferred embodiment of the invention. At step 300, an electronics board is placed into a set up fixture. It is anticipated that step 300 takes place offline of any automated manufacturing equipment. The method continues at step 310, where a substantially blank transparent template is overlaid on the electronics board. This overlaying allows an operator, perhaps assisted by a computer, to determine (at step 320) the locations on the electronics board at which support members can be placed without interfering with electronics components located on the first side of the electronics board. At step 330, the substantially transparent blank template is perforated in order to form a perforated template. The method continues at step 340 where the perforated template is placed onto a support plate. At step 350, the support members are inserted through the perforations of the perforated template and adhered to an underlying support plate.

Figure 7:
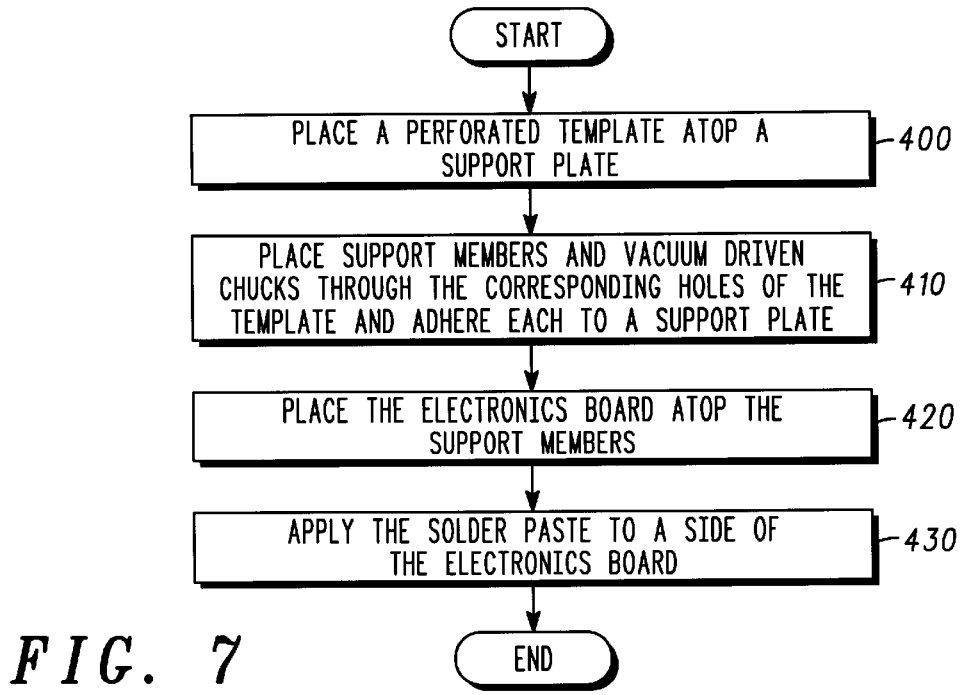
FIG. 7 is a flowchart of another method of retaining an electronics board during application of a solder paste in accordance with a preferred embodiment of the invention.

FIG. 7 is a flowchart of another method of retaining an electronics board during application of a solder paste in accordance with a preferred embodiment of the invention. The apparatus of FIG. 1 using the vacuum driven chuck of FIG. 3 is suitable for performing the method of FIG. 7. The method begins at step 400, where a perforated template is placed atop a support plate. Preferably, the template of step 400 includes perforations corresponding to support locations on the electronics board as well as perforations corresponding to suitable locations where vacuum driven chucks can be used to positively retain the electronics board during the application of solder paste to the electronics board. At step 410, support members and vacuum driven chucks are placed through the corresponding holes of the template of step 400 and adhered to a support plate. At step 420, the electronics board is placed atop the support members. At step 430, solder paste is applied to a second side of the electronics board.

FIG. 8 is an exploded view of an apparatus for electronics board retention during automated component placement in accordance with a preferred embodiment of the invention. In FIG. 8, support plate 500 is similar to support plate 100 of FIG. 1 with the exception that support plate 500 includes a grid perforation pattern, wherein a perforation or hole is present at regular horizontal and vertical intervals of the support plate. For a particular electronics board, such as electronics board 150 of FIG. 1, template 610 is used to identify those locations on support plate 500 where support pins 620 can be placed in order to support the electronics board during automated placement of components on the second side of electronics board 150.

In a preferred embodiment, template 610 is fabricated by placing a substantially transparent blank template over first side 152 of electronics board 150. This blank template includes a grid pattern which substantially embodies or represents the grid perforations pattern of support plate 500. With the blank template overlaid atop the first side of electronics board 150, the grid locations where support pins 620 can be placed is then determined. Template 610, which includes only the perforations appropriate to support electronics board 150, is then created. Template 610 is then placed over support plate 500 and held in place by way of guide pins 640 and guide pin holes 650, shown in a representative location in FIG. 8. Support pins 620 are then placed into support plate 500 at the appropriate locations imposed by template 610. Template 610 can then be removed and electronics board 150 retained while solder paste is applied to second side 154.

Although the apparatus of FIG. 8 is particularly useful when used in conjunction with automated component placement, nothing prevents the use of an apparatus similar to that of FIG. 8 during other manufacturing operations, such as screen printers which apply solder paste to electronics boards described in reference to FIGS. 1 and 5, herein.

FIG. 9 is a flowchart of a method for determining a support member arrangement used in retaining an electronics board during automated component placement in accordance with an alternate embodiment of the invention. The method begins at step 700 where a transparent grid is overlaid atop a first side of an electronics board. Preferably, the substantially transparent grid includes perforations at each grid location, wherein the grid location substantially embodies the grid perforation pattern of a support plate. The method continues at step 710, where a determination is made as to the support pin locations appropriate for the first side of the electronics board. Preferably, these pin locations correspond to areas not populated by electronics components on the electronics board.

The method continues at step 720 where a template, which incorporates perforations at the support pin locations determined at step 710, is placed atop the support plate. Also in step 720, support pins are placed within the support plate at the locations dictated by the template. At step 730, the template is removed, and an electronics board is placed atop the support pins. The electronics board may then be held into place by way of a clamp or other means of restricting lateral movement of the electronics board.

In conclusion, a method and apparatus for electronics board retention during manufacturing operations can eliminate the need for support plates having customized support member arrangements for each electronics board type. Thus, a single support plate and a small set of support members or support pins can replace a large number of customized support plates and permanently affixed support struts used in several manufacturing operations. This can be especially advantageous in high mix manufacturing environments where many such support plates incorporating unique support member arrangements are needed in order to conduct manufacturing operations on each type of electronics board. Additionally, the method and apparatus can significantly reduce the setup time required to prepare the equipment used in manufacturing operations such as solder paste application and automated component location. The method and apparatus do not require sophisticated tooling and can be used in conjunction with various equipment types used in electronics board manufacturing environments.

Accordingly, it is intended by the appended claims to cover all modifications of the invention that fall within the true scope and spirit of the invention.

What is claimed is:

1. A method for determining a support member arrangement used in retaining an electronics board during a manufacturing operation, comprising:

overlaying a substantially transparent blank template over a first side of an electronics board;

determining locations on said first side of said electronics board where support members can be placed without interfering with components mounted on said first side of said electronics board;

perforating said substantially transparent blank template at said locations in order to form a perforated template;

placing said perforated template onto a support plate;

inserting said support members through holes of said perforated template in order for said support members to adhere to said support plate; and retaining said electronics board using said support members during an application of solder paste to a second side of said electronics board.

2. The method of claim 1, wherein each of said support members includes a magnet for adhering each of said support members to said support plate.

3. The method of claim 1, additionally comprising securing said electronics board to said support members using at least one vacuum driven chuck placed between said electronics board and said support plate.

4. The method of claim 3, wherein said at least one vacuum driven chuck includes chamfered metallic top surface and a billowed nozzle for restricting lateral movement of said electronics board during said securing step.

5. The method of claim 3, wherein said at least one vacuum driven chuck includes a magnet for adhering said at least one vacuum driven chuck to said support plate.

* * * * *